(12) United States Patent
Ha et al.

(10) Patent No.: US 11,362,141 B2
(45) Date of Patent: Jun. 14, 2022

(54) VARIABLE RESISTANCE MEMORY DEVICE

(71) Applicant: Samsung Electronics Co., Ltd., Suwon-si (KR)

(72) Inventors: Taehong Ha, Suwon-si (KR); Jaerok Kahng, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 132 days.

(21) Appl. No.: 16/845,518

(22) Filed: Apr. 10, 2020

(65) Prior Publication Data

US 2021/0126054 A1 Apr. 29, 2021

(30) Foreign Application Priority Data

Oct. 23, 2019 (KR) .......................... 10-2019-0132154

(51) Int. Cl.
| | | |
|---|---|---|
| *H01L 27/24* | (2006.01) | |
| *H01L 45/00* | (2006.01) | |
| *G11C 13/00* | (2006.01) | |

(52) U.S. Cl.
CPC ...... *H01L 27/2481* (2013.01); *G11C 13/0004* (2013.01); *G11C 13/0011* (2013.01); *G11C 13/0021* (2013.01); *H01L 45/06* (2013.01)

(58) Field of Classification Search
CPC ............. H01L 27/2481; H01L 27/2409; H01L 27/2427; H01L 45/06; H01L 45/1233; H01L 45/122; H01L 45/1253; G11C 13/0021; G11C 13/0011; G11C 13/0004; G11C 13/003; G11C 2213/71
See application file for complete search history.

(56) References Cited

U.S. PATENT DOCUMENTS

| | | | |
|---|---|---|---|
| 7,402,897 B2 | 7/2008 | Leedy | |
| 8,031,509 B2 | 10/2011 | Schloss et al. | |
| 8,093,577 B2* | 1/2012 | Lowrey | H01L 45/1233 |
| | | | 257/4 |
| 8,222,677 B2 | 7/2012 | Baba et al. | |
| 8,604,456 B2 | 12/2013 | Kinoshita et al. | |
| 8,767,462 B2* | 7/2014 | Yun | H01L 27/11565 |
| | | | 365/185.05 |
| 9,252,097 B2* | 2/2016 | Baba | H01L 27/2409 |
| 9,716,129 B1 | 7/2017 | Sim et al. | |
| 10,262,715 B2 | 4/2019 | Bedeschi | |
| 2019/0172502 A1* | 6/2019 | Jeong | G11C 5/025 |

* cited by examiner

*Primary Examiner* — Allison Bernstein

(74) *Attorney, Agent, or Firm* — Harness, Dickey & Pierce, P.L.C.

(57) ABSTRACT

A variable resistance memory device includes lower conductive lines on a substrate, upper conductive lines on the lower conductive lines to cross the lower conductive lines, and memory cells between the lower conductive lines and the upper conductive lines. The lower conductive lines are extended in a first direction and are spaced apart from each other in a second direction crossing the first direction. Each of the lower conductive lines include a first line portion extended in the first direction, a second line portion offset from the first line portion in the second direction and extended in the first direction, and a connecting portion connecting the first line portion to the second line portion.

20 Claims, 15 Drawing Sheets

VARIABLE RESISTANCE MEMORY DEVICE

CROSS-REFERENCE TO RELATED APPLICATIONS

This U.S. non-provisional patent application claims priority under 35 U.S.C. § 119 to Korean Patent Application No. 10-2019-0132154, filed on Oct. 23, 2019, in the Korean Intellectual Property Office, the entire contents of which are hereby incorporated by reference.

BACKGROUND

The present disclosure relates to semiconductor devices, and in particular, to variable resistance memory devices.

Semiconductor memory devices are classified into volatile memory devices and nonvolatile memory devices. The volatile memory devices lose their stored data when their power supply is interrupted, and a dynamic random access memory (DRAM) device and a static random access memory (SRAM) device are typical examples of the volatile memory devices. On the contrary, the nonvolatile memory devices retain their data even when their power supply is interrupted and a programmable read only memory (PROM) device, an erasable PROM (EPROM) device, an electrically EPROM (EEPROM) device, and a flash memory device are typical examples of the nonvolatile memory devices.

To meet the recent demand for semiconductor memory devices with high performance and low power consumption, next-generation semiconductor memory devices, such as a magnetic random access memory (MRAM) and a phase-change random access memory (PRAM), have been developed. A material or structure of such a next-generation semiconductor memory device has a resistance property that is changed by a current or voltage forced thereto and is not changed even when a current or voltage supply is interrupted.

SUMMARY

An example embodiment of the inventive concepts provides a variable resistance memory device with a reduced chip size.

An example embodiment of the inventive concepts provides a variable resistance memory device with a simple interconnection structure.

According to some example embodiments of the inventive concepts, a variable resistance memory device may include a substrate, lower conductive lines on the substrate, the lower conductive lines being extended in a first direction and being spaced apart from each other in a second direction crossing the first direction, upper conductive lines on the lower conductive lines to cross the lower conductive lines, and memory cells between the lower conductive lines and the upper conductive lines. Each of the lower conductive lines may include a first line portion extended in the first direction, a second line portion offset from the first line portion in the second direction and extended in the first direction, and a connecting portion connecting the first line portion to the second line portion.

According to some example embodiments of the inventive concepts, a variable resistance memory device may include a substrate, a peripheral circuit portion on the substrate and a first cell stack and a second cell stack sequentially stacked on the peripheral circuit portion. The first cell stack may include first lower conductive lines extended in a first direction and spaced apart from each other in a second direction crossing the first direction, first upper conductive lines on the first lower conductive lines to cross the first lower conductive lines, and first memory cells between the first lower conductive lines and the first upper conductive lines. The second cell stack may include second lower conductive lines, which are extended in the first direction and are spaced apart from each other in the second direction. The first lower conductive lines and the second lower conductive lines may be alternately arranged in the second direction.

According to some example embodiments of the inventive concepts, a variable resistance memory device may include a substrate, a peripheral circuit portion on the substrate and a first cell stack and a second cell stack sequentially stacked on the substrate. The second cell stack may include lower conductive lines, upper conductive lines on the lower conductive lines to cross the lower conductive lines, memory cells between the lower conductive lines and the upper conductive lines, lower contacts connected to the lower conductive lines, and upper contacts connected to the upper conductive lines. Each of the lower contacts and the upper contacts penetrates the first cell stack and may be connected to the peripheral circuit portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
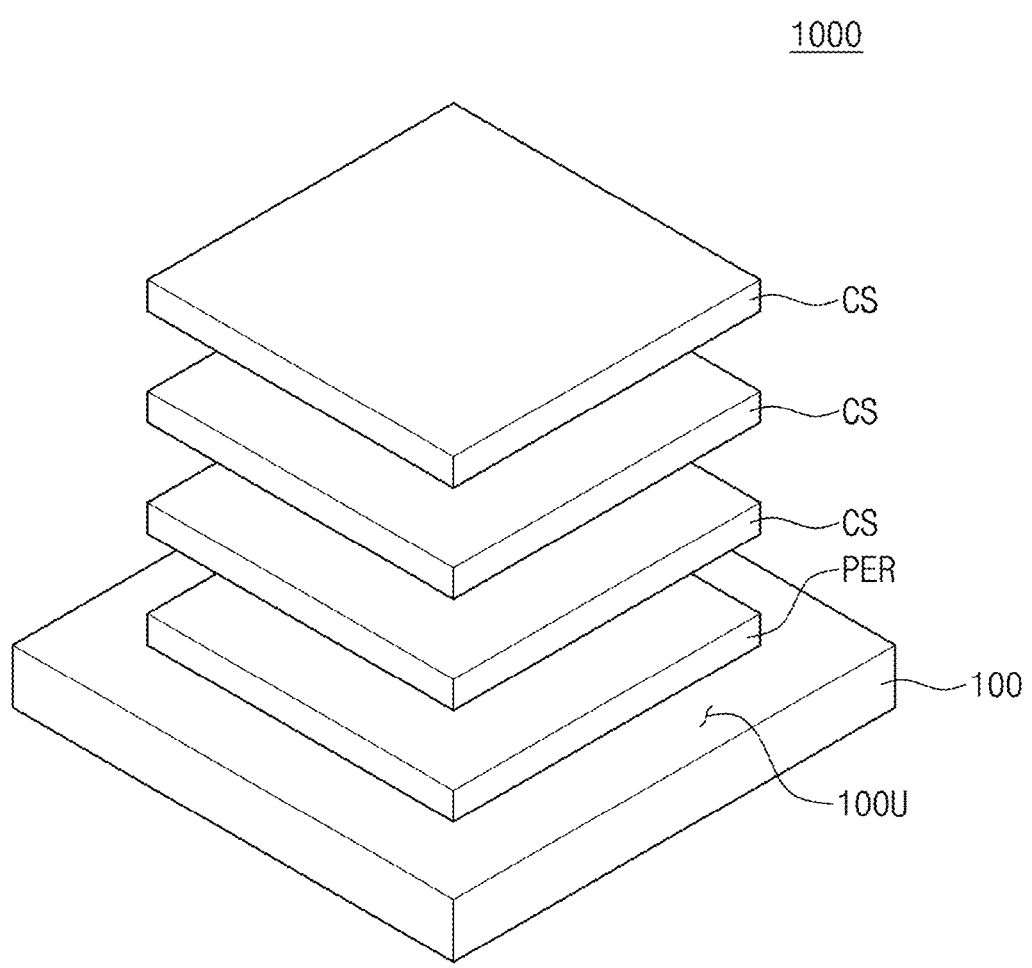
FIG. 1 is a conceptual diagram illustrating a variable resistance memory device according to some example embodiments of the inventive concept.
Figure 2:
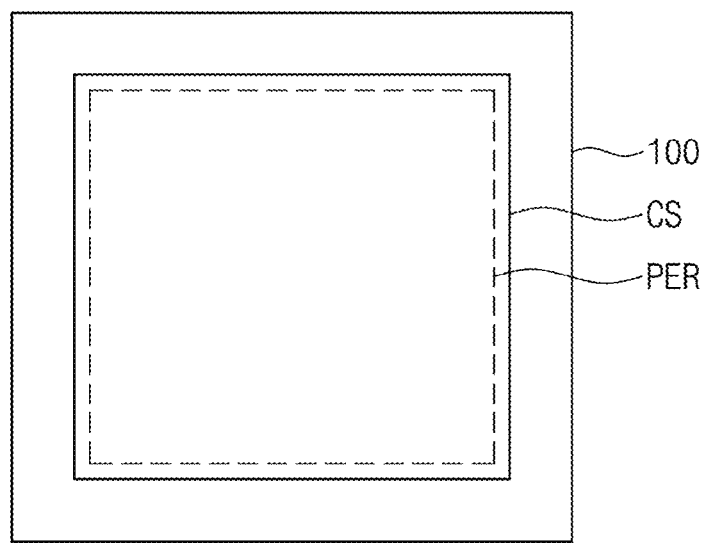
FIG. 2 is a schematic plan view of the variable resistance memory device of FIG. 1.

FIG. 1 is a conceptual diagram illustrating a variable resistance memory device according to some example embodiments of the inventive concept. FIG. 2 is a schematic plan view of the variable resistance memory device of FIG. 1, and FIG. 3 is a perspective view schematically illustrating each cell stack of FIG. 1.

Referring to FIGS. 1 and 2, a variable resistance memory device 1000 may include a peripheral circuit portion PER on a substrate 100 and a plurality of cell stacks CS sequentially stacked on the peripheral circuit portion PER. FIG. 1 illustrates an example including three cell stacks CS, but the inventive concepts are not limited to this example. The peripheral circuit portion PER may be disposed between the lowermost cell stack of the cell stacks CS and the substrate 100. The peripheral circuit portion PER may be vertically overlapped with the cell stacks CS and may be locally disposed below the cell stacks CS.

Figure 3:
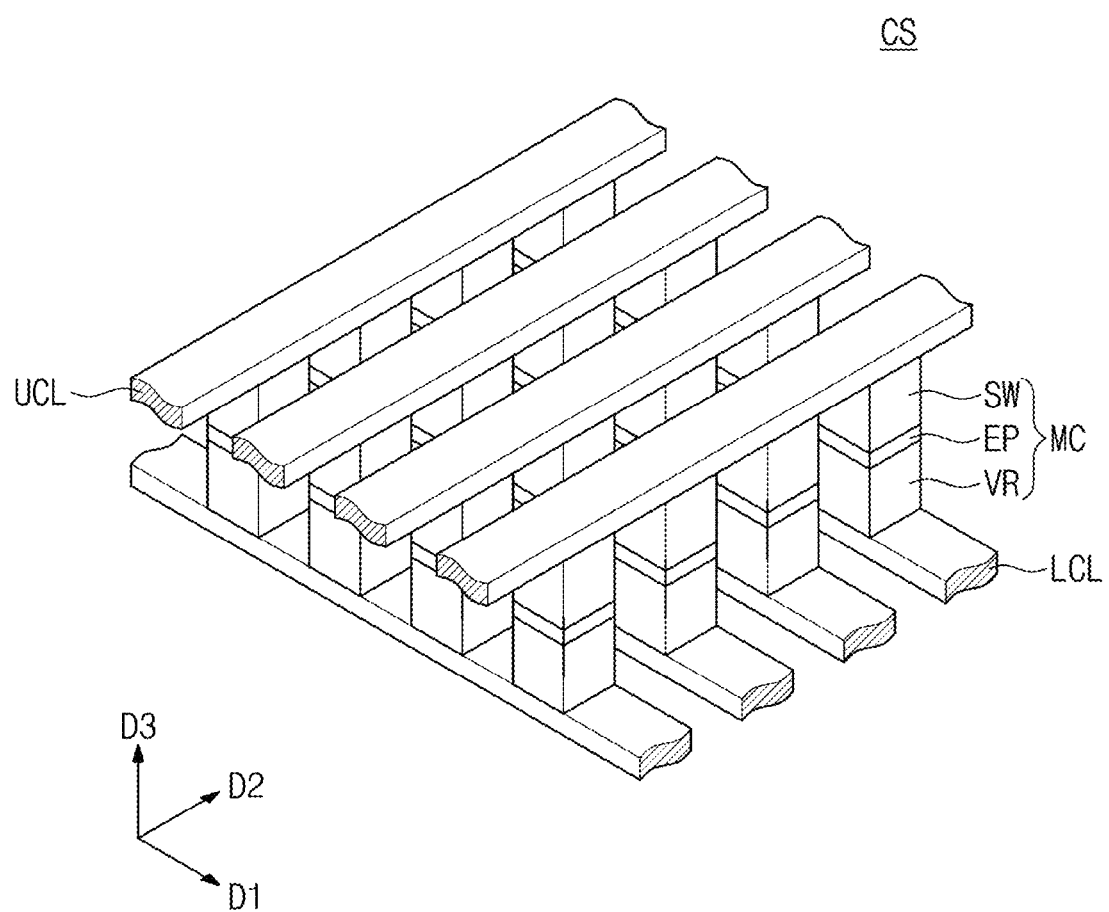
FIG. 3 is a perspective view schematically illustrating each cell stack of FIG. 1.

Referring to FIG. 3, each of the cell stacks CS may include lower conductive lines LCL, upper conductive lines UCL crossing the lower conductive lines LCL, and memory cells MC between the lower conductive lines LCL and the upper conductive lines UCL. The lower conductive lines LCL may be extended in a first direction D1 and may be spaced apart from each other in a second direction D2 crossing the first direction D1. The upper conductive lines UCL may be spaced apart from the lower conductive lines LCL in a third direction D3 that is perpendicular to the first and second directions D1 and D2. The upper conductive lines UCL may be extended in the second direction D2 and may be spaced apart from each other in the first direction D1. The first and second directions D1 and D2 may be parallel to a top surface 100U of the substrate 100 of FIG. 1, and the third direction D3 may be perpendicular to the top surface 100U of the substrate 100. The lower conductive lines LCL and the upper conductive lines UCL may be formed of or include at least one of metallic materials (e.g., copper, tungsten, and/or aluminum) and/or metal nitrides (e.g., tantalum nitride, titanium nitride, and/or tungsten nitride).

The memory cells MC may be disposed at intersection points of the lower conductive lines LCL and the upper conductive lines UCL. The memory cells MC may be two-dimensionally arranged in the first and second directions D1 and D2. Each of the memory cells MC may include a variable resistance pattern VR and a switching pattern SW. The variable resistance pattern VR and the switching pattern SW may be stacked in the third direction D3 between a pair of conductive lines LCL and UCL connected thereto. The variable resistance pattern VR and the switching pattern SW may be connected in series to each other. For example, the variable resistance pattern VR and the switching pattern SW, which are included in each of the memory cells MC, may be connected in series to each other between a corresponding one of the lower conductive lines LCL and a corresponding one of the upper conductive lines UCL. FIG. 3 illustrates an example, in which the switching pattern SW is disposed on the variable resistance pattern VR, but the inventive concepts are not limited to this example. For example, the variable resistance pattern VR may be disposed on the switching pattern SW, unlike that shown in FIG. 3.

The variable resistance pattern VR may include a material, which has a variable resistance property, and this may make it possible to use the variable resistance pattern VR as a data-storing element. In some example embodiments, the variable resistance pattern VR may include a material whose phase can be changed to one of crystalline and amorphous structures, depending on its temperature. The variable resistance pattern VR may include a compound, in which at least one of chalcogen elements (e.g., Te and/or Se) and at least one of Ge, Sb, Bi, Pb, Sn, Ag, As, S, Si, In, Ti, Ga, P, O, and C are contained. For example, the variable resistance pattern VR may be formed of or include at least one of GeSbTe, GeTeAs, SbTeSe, GeTe, SbTe, SeTeSn, GeTeSe, SbSeBi, GeBiTe, GeTeTi, InSe, GaTeSe, or InSbTe. In some example embodiments, the variable resistance pattern VR may have a super lattice structure, in which a germanium-containing layer (e.g., GeTe layer) and a germanium-free layer (e.g., SbTe layer) are repeatedly stacked. In some example embodiments, the variable resistance pattern VR may be formed of or include at least one of perovskite compounds and/or conductive metal oxides. For example, the variable resistance pattern VR may be formed of or include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide. In some example embodiments, the variable resistance pattern VR may have a double-layered structure including a conductive metal oxide layer and a tunnel insulating layer or a triple-layered structure including a first conductive metal oxide layer, a tunnel insulating layer, and a second conductive metal oxide layer. In some example embodiments, the tunnel insulating layer may be formed of or include aluminum oxide, hafnium oxide, and/or silicon oxide.

In some example embodiments, the switching pattern SW may include a silicon diode or an oxide diode having a rectifying property. For example, the switching pattern SW may be composed of a silicon diode, in which a p-type silicon layer and an n-type silicon layer are in contact with each other, or may be composed of an oxide diode, in which a p-type NiOx layer and an n-type TiOx layer are in contact with each other or a p-type CuOx layer and an n-type TiOx layer are in contact with each other. As in some example embodiments, the switching pattern SW may include an oxide material (e.g., ZnOx, MgOx, and/or AlOx), which has a high-resistance or current-blocking property under conditions below a specific voltage and has a low-resistance or current-conduction property under conditions above the specific voltage. As in some example embodiments, the switching pattern SW may be an ovonic threshold switch (OTS) device having a bi-directional property. In some example embodiments, the switching pattern SW may include a chalcogenide material, which is in a substantially amorphous state. Here, the substantially amorphous state does not exclude a crystalline structure of an object, in which crystalline grains locally exist or a locally crystallized portion exists. The chalcogenide material may include a compound containing at least one of chalcogen elements, such as Te and/or Se, and at least one of Ge, Sb, Bi, Al, Pb, Sn, Ag, As, S, Si, In, Ti, Ga, or P. The chalcogenide material may, for example, include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe.

Each of the memory cells MC may further include an electrode layer EP interposed between the variable resistance pattern VR and the switching pattern SW. The electrode layer EP may electrically connect the variable resistance pattern VR to the switching pattern SW, while preventing the variable resistance pattern VR from being in direct contact with the switching pattern SW. The electrode layer EP may be formed of or include at least one of, for example, W, Ti, Al, Cu, C, CN, TiN, TiAlN, TiSiN, TiCN, WN, CoSiN, WSiN, TaN, TaCN, or TaSiN.

Referring back to FIGS. 1 and 2, the peripheral circuit portion PER may include peripheral circuits, which are used to operate the memory cells MC of the cell stacks CS. The peripheral circuits may include a first decoder circuit, which is connected to the lower conductive lines LCL of the cell stacks CS, a second decoder circuit, which is connected to the upper conductive lines UCL of the cell stacks CS, and an input/output (I/O) sense amplifier, which is connected to the lower conductive lines LCL or the upper conductive lines UCL.

Figure 4:
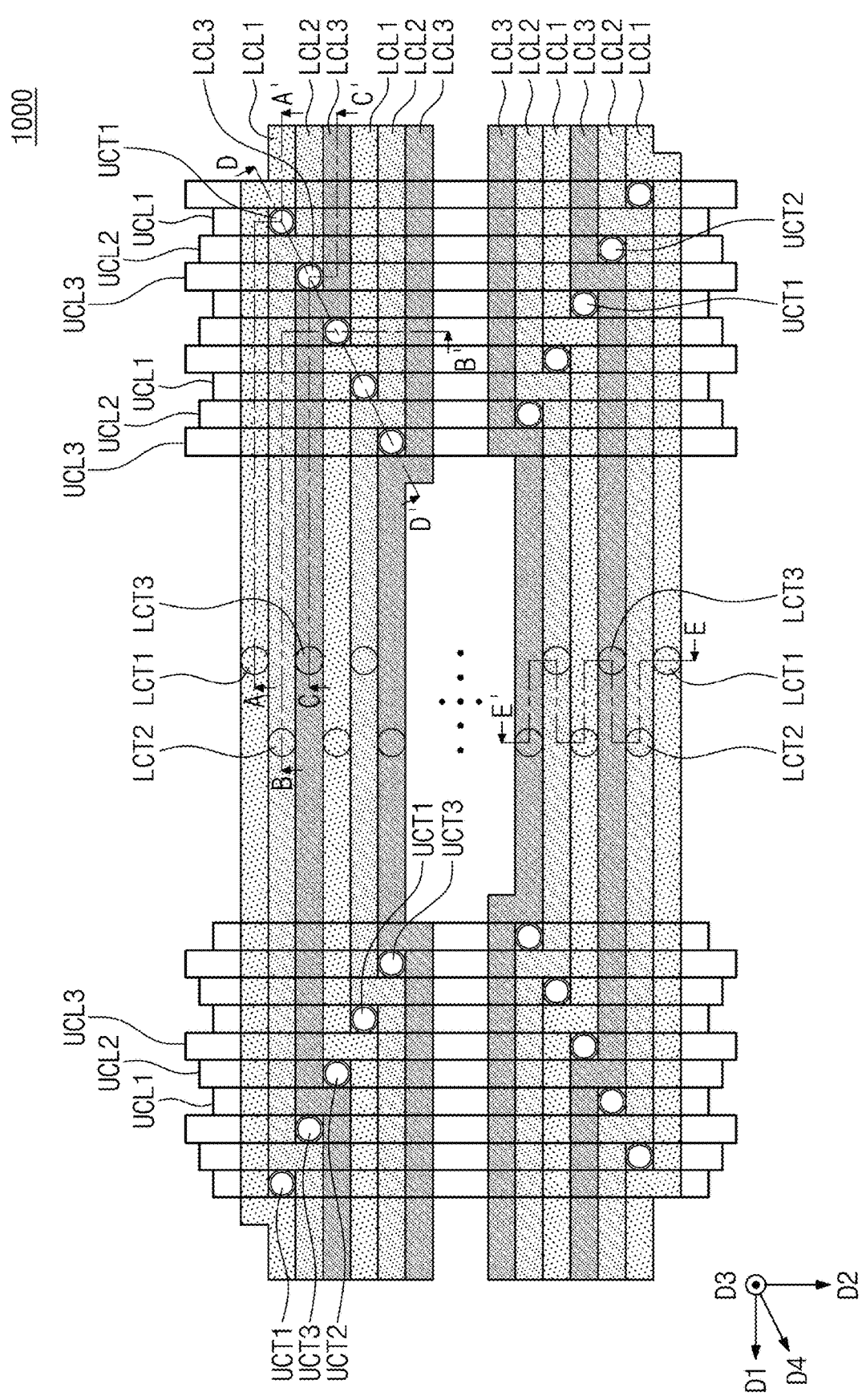
FIG. 4 is a plan view illustrating a variable resistance memory device according to some example embodiments of the inventive concept.
Figure 5A:
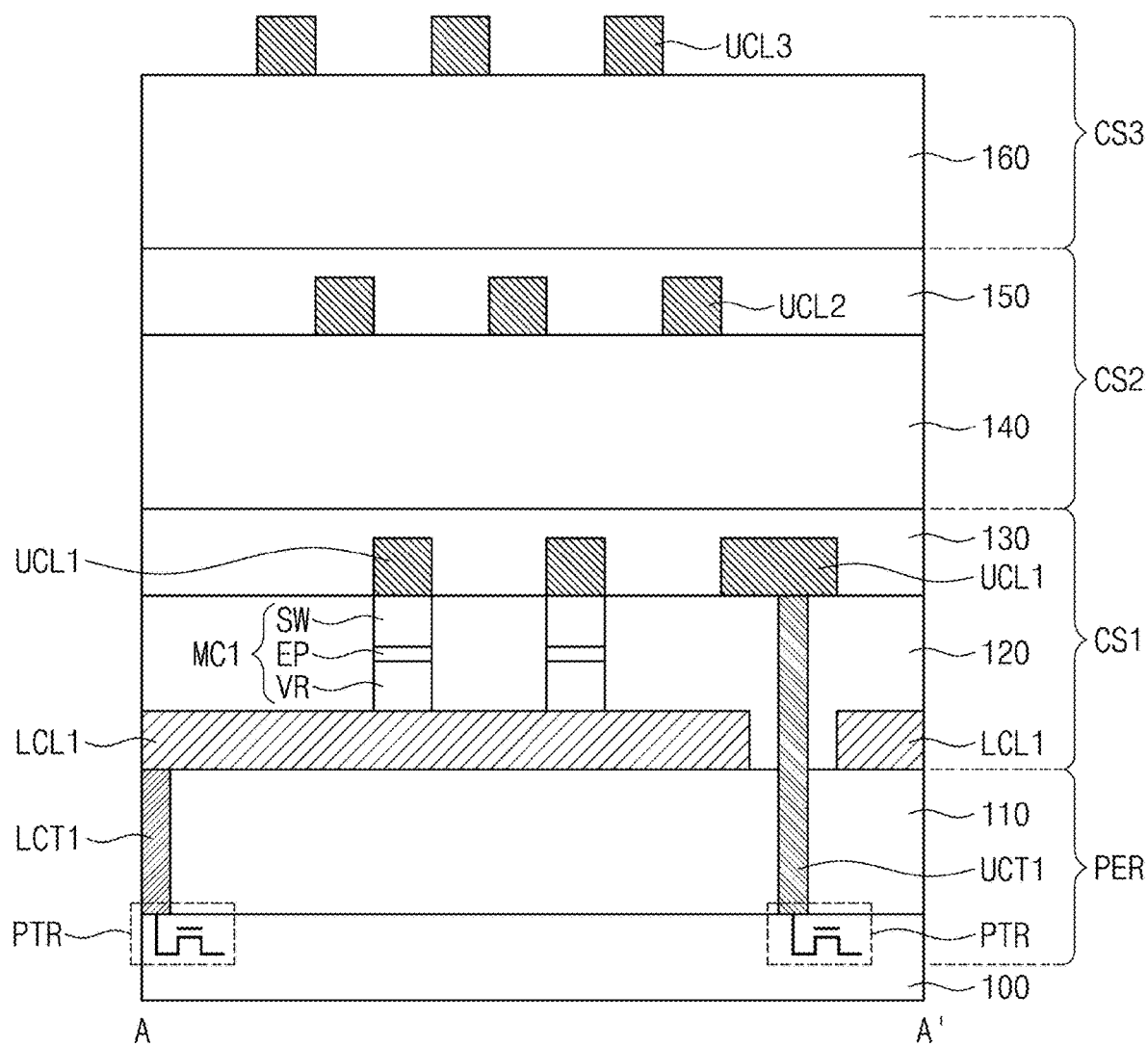
FIGS. 5A, 5B, and 5C are sectional views taken along lines A-A', B-B', and C-C' of FIG. 4, respectively.
Figure 5B:
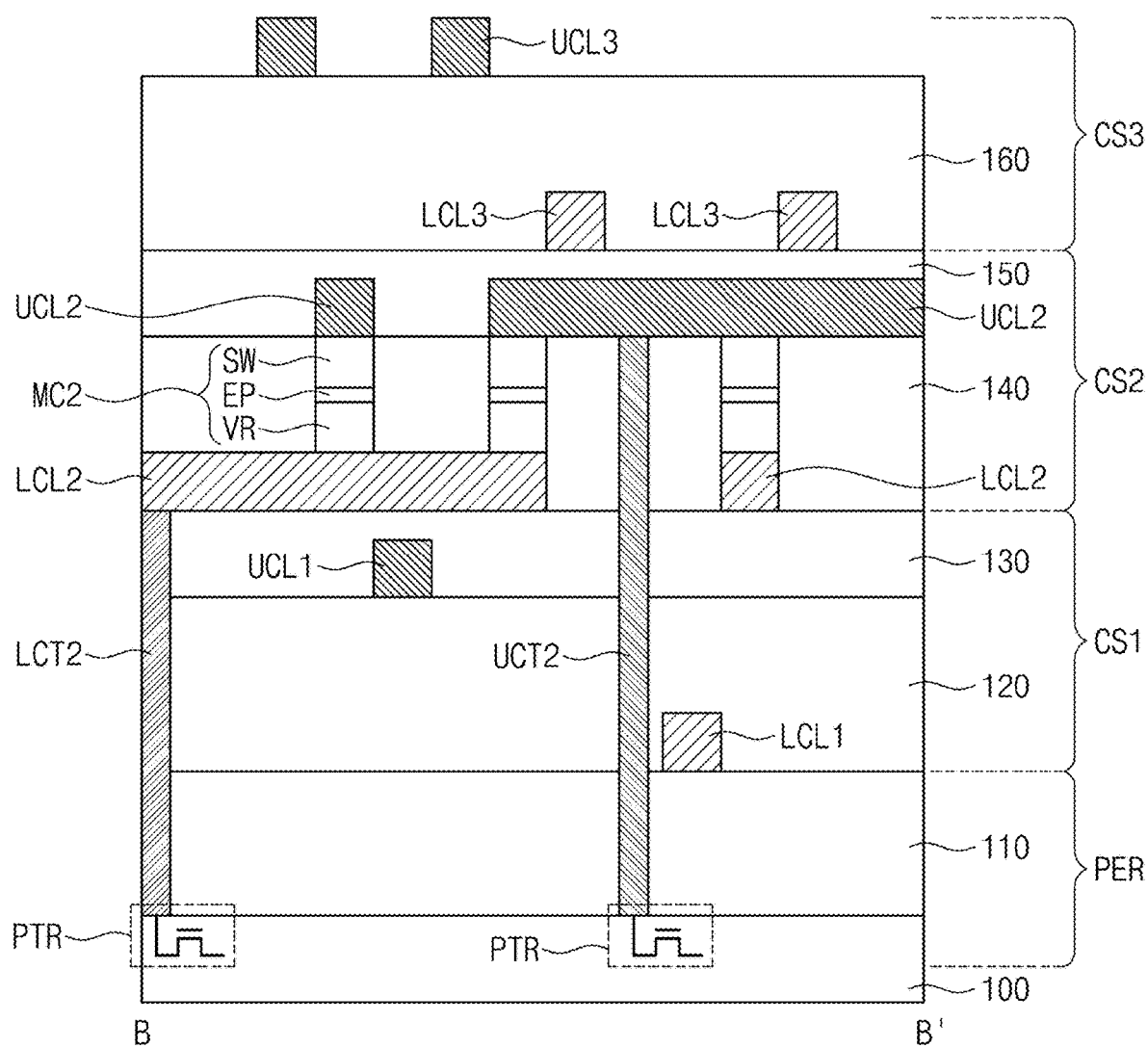
Figure 5C:
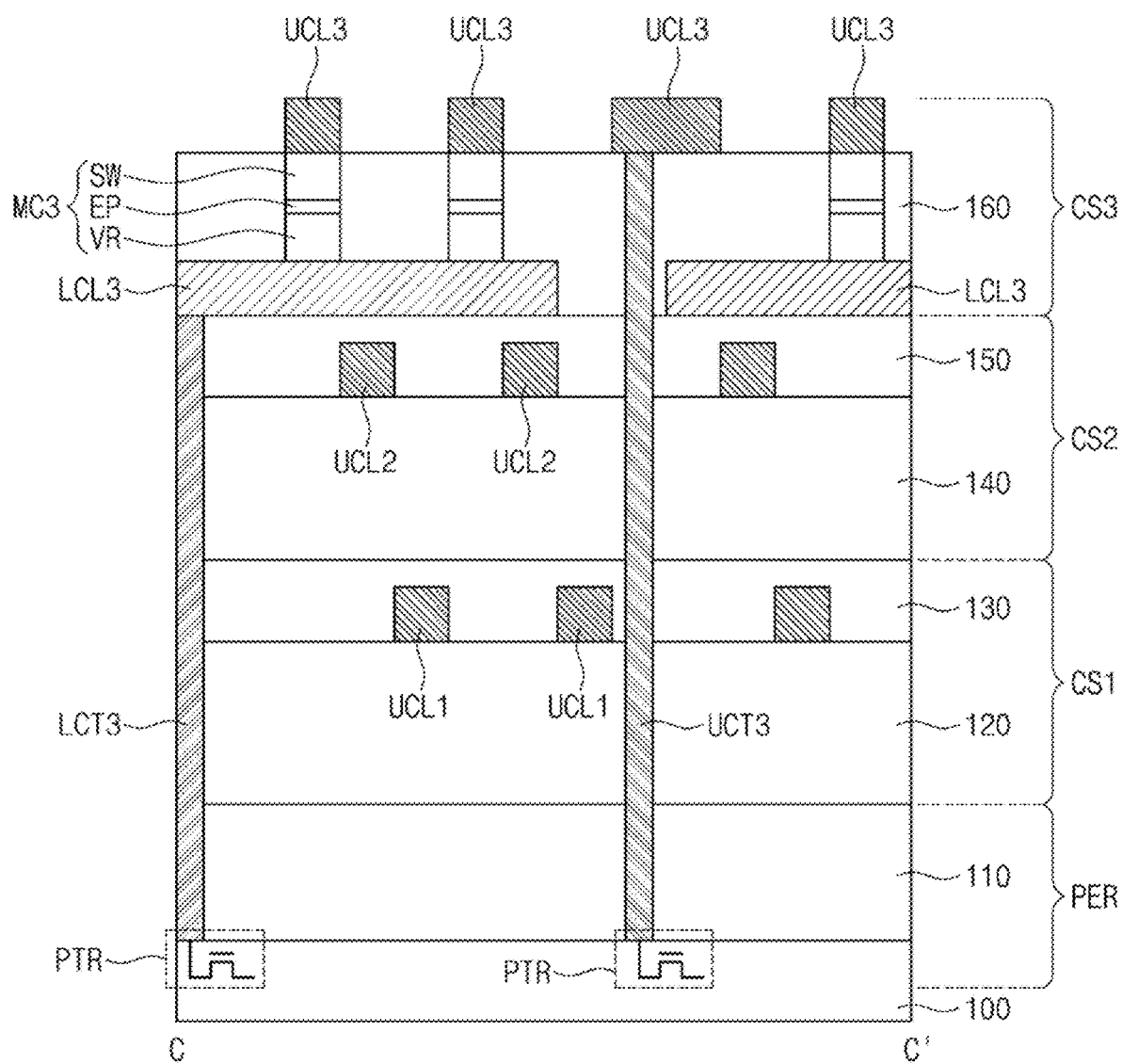

FIG. 4 is a plan view illustrating a variable resistance memory device according to some example embodiments of the inventive concepts, and FIGS. 5A, 5B, and 5C are sectional views taken along lines A-A', B-B', and C-C' of FIG., respectively. For the sake of brevity, the following description will refer to an example of a variable resistance memory device 1000, in which three cell stacks CS are stacked.

Referring to FIGS. 4, 5A, 5B, and 5C, a peripheral circuit portion PER may be disposed on a substrate 100. The peripheral circuit portion PER may include peripheral transistors PTR and a first interlayered insulating layer 110 covering the peripheral transistors PTR. The first interlayered insulating layer 110 may be formed of or include at least one of, for example, oxide, nitride, and/or oxynitride. A first cell stack CS1, a second cell stack CS2, and a third cell stack CS3 may be sequentially stacked on the peripheral circuit portion PER. The peripheral transistors PTR may be vertically overlapped with the first to third cell stacks CS1, CS2, and CS3 and may be locally disposed below the first to third cell stacks CS1, CS2, and CS3. The peripheral transistors PTR may constitute (or be formed of) peripheral circuits, which are used to operate the memory cells MC of the first to third cell stacks CS1, CS2, and CS3.

The first cell stack CS1 may include first lower conductive lines LCL1, first upper conductive lines UCL1 crossing the first lower conductive lines LCL1, and first memory cells MC1 between the first lower conductive lines LCL1 and the first upper conductive lines UCL1. The first lower conductive lines LCL1 may be disposed on the first interlayered insulating layer 110. The first lower conductive lines LCL1 may be extended in the first direction D1 and may be spaced apart from each other in the second direction D2. The first upper conductive lines UCL1 may be vertically spaced apart from the first lower conductive lines LCL1 in the third direction D3. The first upper conductive lines UCL1 may be extended in the second direction D2 and may be spaced apart from each other in the first direction D1. Each of the first lower conductive lines LCL1 and the first upper conductive lines UCL1 may be formed of or include at least one of metallic materials (e.g., copper, tungsten, and/or aluminum) and/or metal nitrides (e.g., tantalum nitride, titanium nitride, and/or tungsten nitride). The first memory cells MC1 may be selectively provided at intersection points of the first lower conductive lines LCL1 and the first upper conductive lines UCL1. Each of the first memory cells MC1 may include the variable resistance pattern VR, the switching pattern SW, and the electrode layer EP, which were described with reference to FIG. 3.

The first cell stack CS1 may include second interlayered insulating layer 120 and third interlayered insulating layer 130, which are sequentially stacked on the first interlayered insulating layer 110. The second interlayered insulating layer 120 may cover the first lower conductive lines LCL1 and may cover side surfaces of the first memory cells MC1. The first upper conductive lines UCL1 may be disposed on the second interlayered insulating layer 120. The third interlayered insulating layer 130 may be disposed on the second interlayered insulating layer 120 to cover the first upper conductive lines UCL1. The second and third interlayered insulating layers 120 and 130 may be formed of or include at least one of, for example, oxide, nitride, and/or oxynitride.

The first cell stack CS1 may include first lower contacts LCT1, which are selectively connected to the first lower conductive lines LCL1, and first upper contacts UCT1, which are selectively connected to the first upper conductive lines UCL1. Each of the first lower contacts LCT1 may be vertically extended from a bottom surface of each of the first lower conductive lines LCL1 toward the substrate 100. Each of the first lower contacts LCT1 may be provided to penetrate the first interlayered insulating layer 110 and may be connected to a terminal of a corresponding one of the peripheral transistors PTR. Each of the first upper contacts UCT1 may be vertically extended from a bottom surface of each of the first upper conductive lines UCL1 into a region between adjacent ones of the first lower conductive lines LCL1. Each of the first upper contacts UCT1 may be provided to penetrate the second interlayered insulating layer 120 between adjacent ones of the first memory cells MC1 and to penetrate the first interlayered insulating layer 110 and may be connected to a terminal of a corresponding one of the peripheral transistors PTR. Each of the first upper contacts UCT1 may penetrate the first and second interlayered insulating layers 110 and 120 such that the first upper contacts UCT1 do not intersect, or, alternatively, contact (e.g., directly, electrically) any of the first lower lines LCL1 or first lower contacts LCT1.

Figure 6:
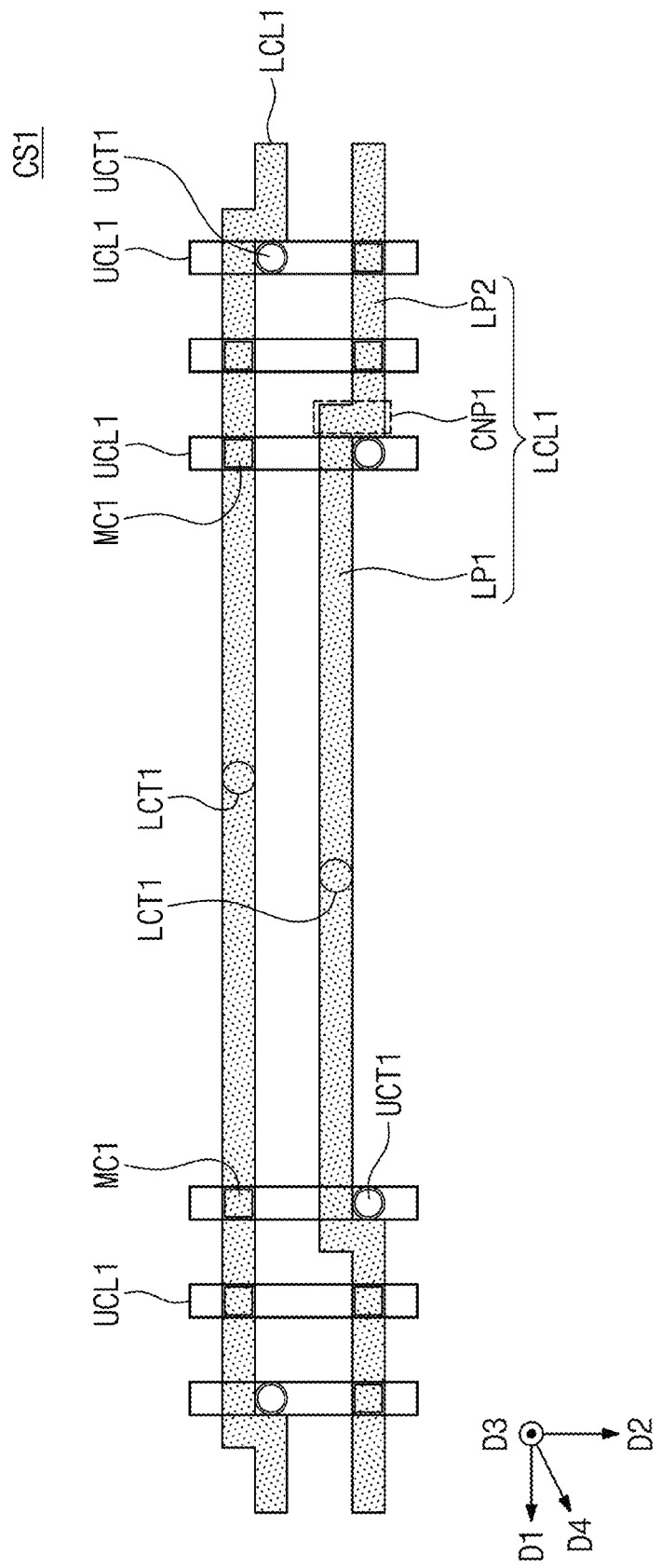
FIGS. 6 and 7 are a plan view and a perspective view illustrating a portion of a first cell stack.
Figure 7:
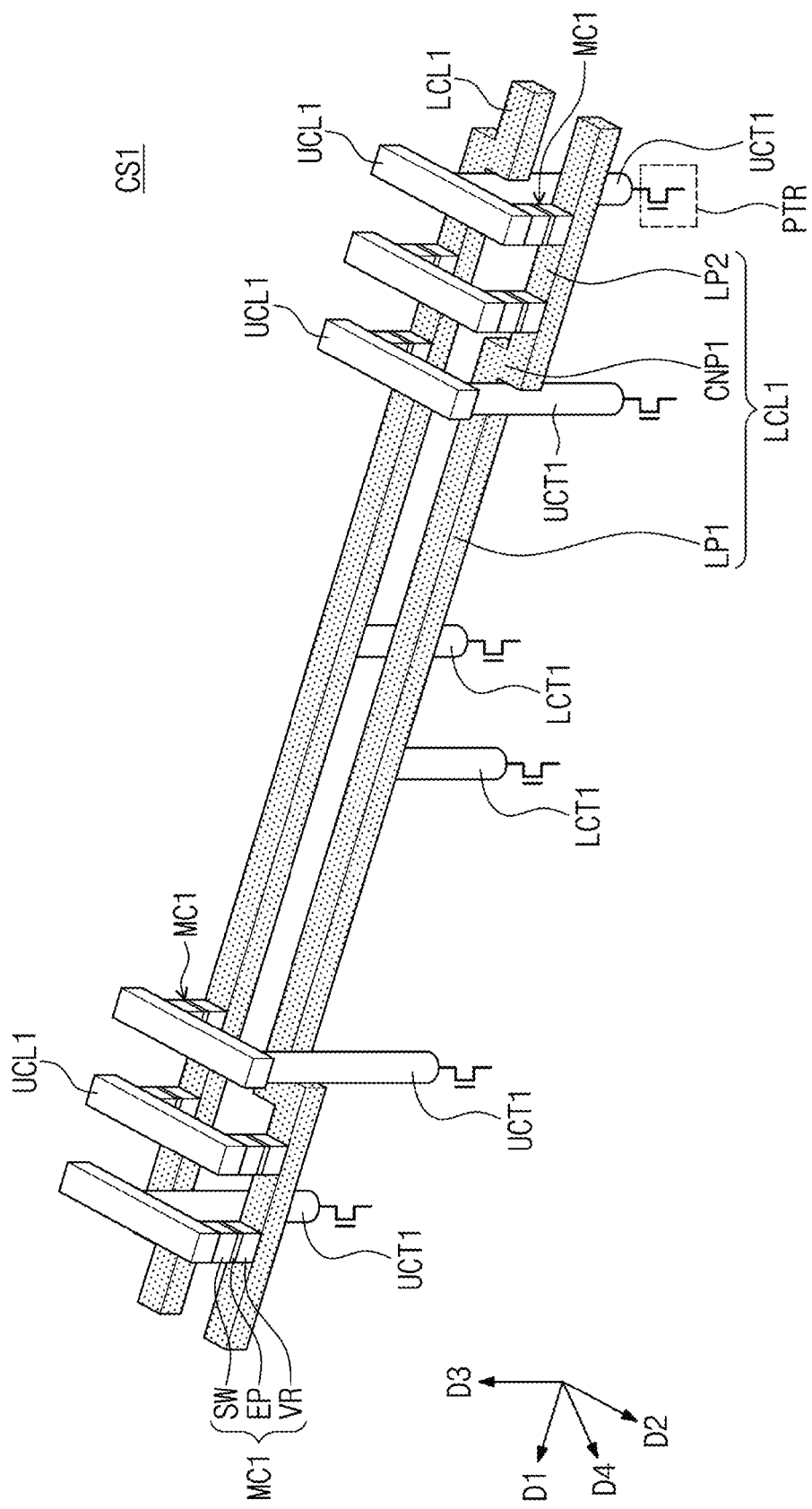

FIGS. 6 and 7 are a plan view and a perspective view illustrating a portion of a first cell stack CS1.

Referring to FIGS. 4, 6, and 7, each of the first lower conductive lines LCL1 may include a first line portion LP1, which is extended in the first direction D1, a second line portion LP2, which is offset from the first line portion LP1 in the second direction D2 and is extended in the first direction D1, and a first connecting portion CNP1, which connects the first line portion LP1 to the second line portion LP2. Each of the first lower conductive lines LCL1 may have a bent line shape. The first lower conductive lines LCL1 may be disposed, such that the first connecting portions CNP1 of the first lower conductive lines LCL1 are aligned to each other in a fourth direction D4 crossing the first and second directions D1 and D2. The fourth direction D4 may be parallel to the top surface 100U of the substrate 100 of FIG. 1.

The first line portion LP1 of each of the first lower conductive lines LCL1 may be provided to cross corresponding ones of the first upper conductive lines UCL1. The second line portion LP2 of each of the first lower conductive lines LCL1 may be provided to cross corresponding ones of the first upper conductive lines UCL1. The first memory cells MC1 may be selectively provided at intersection points of the first line portion LP1 of each of the first lower conductive lines LCL1 and the first upper conductive lines UCL1 and at intersection points of the second line portion LP2 of each of the first lower conductive lines LCL1 and the first upper conductive lines UCL1.

Each of the first lower contacts LCT1 may be vertically extended in the third direction D3. As an example, each of the first lower contacts LCT1 may be connected to the first or second line portion LP1 or LP2 of each of the first lower conductive lines LCL1, but the inventive concepts are not limited to this example. Each of the first lower contacts LCT1 may be vertically extended from a bottom surface of each of the first lower conductive lines LCL1 toward the substrate 100 and may be connected to a corresponding one of the peripheral transistors PTR.

Each of the first upper contacts UCT1 may be disposed between the first connecting portions CNP1 of adjacent ones of the first lower conductive lines LCL1. Each of the first upper contacts UCT1 may be disposed to be closer to either of the adjacent ones of the first lower conductive lines LCL1. Each of the first upper contacts UCT1 may be vertically extended from the bottom surface of each of the first upper conductive lines UCL1 into a region between the first connecting portions CNP1 of the adjacent ones of the first lower conductive lines LCL1 and may be connected to a corresponding one of the peripheral transistors PTR.

Referring back to FIGS. 4, 5A, 5B, and 5C, the second cell stack CS2 may include second lower conductive lines LCL2, second upper conductive lines UCL2 crossing the second lower conductive lines LCL2, and second memory cells MC2 between the second lower conductive lines LCL2 and the second upper conductive lines UCL2. The second lower conductive lines LCL2 may be disposed on the third interlayered insulating layer 130. The second lower conductive lines LCL2 may be extended in the first direction D1 and may be spaced apart from each other in the second direction D2. The first lower conductive lines LCL1 and the second lower conductive lines LCL2 may be alternately arranged in the second direction D2 when viewed in a plan view.

The second upper conductive lines UCL2 may be vertically spaced apart from the second lower conductive lines LCL2 in the third direction D3. The second upper conductive lines UCL2 may be extended in the second direction D2 and may be spaced apart from each other in the first direction D1. The first upper conductive lines UCL1 and the second upper conductive lines UCL2 may be alternately arranged in the first direction D1 when viewed in a plan view.

The second lower conductive lines LCL2 and the second upper conductive lines UCL2 may be formed of or include at least one of metallic materials (e.g., copper, tungsten, and/or aluminum) and/or metal nitrides (e.g., tantalum nitride, titanium nitride, and/or tungsten nitride). The second memory cells MC2 may be selectively disposed at intersection points of the second lower conductive lines LCL2 and the second upper conductive lines UCL2. Each of the second memory cells MC2 may include the variable resistance pattern VR, the switching pattern SW, and the electrode layer EP, which were described with reference to FIG. 3.

The second cell stack CS2 may include a fourth interlayered insulating layer 140 and a fifth interlayered insulating layer 150, which are sequentially stacked on the third interlayered insulating layer 130. The fourth interlayered insulating layer 140 may cover the second lower conductive lines LCL2 and may cover side surfaces of the second memory cells MC2. The second upper conductive lines UCL2 may be disposed on the fourth interlayered insulating layer 140. The fifth interlayered insulating layer 150 may be disposed on the fourth interlayered insulating layer 140 to cover the second upper conductive lines UCL2. The fourth and fifth interlayered insulating layers 140 and 150 may be formed of or include at least one of, for example, oxide, nitride, and/or oxynitride.

The second cell stack CS2 may include second lower contacts LCT2, which are selectively connected to the second lower conductive lines LCL2, and second upper contacts UCT2, which are selectively connected to the second upper conductive lines UCL2. Each of the second lower contacts LCT2 may be provided to penetrate the first cell stack CS1 and may be connected to a terminal of a corresponding one of the peripheral transistors PTR. Each of the second lower contacts LCT2 may be vertically extended from a bottom surface of each of the second lower conductive lines LCL2 into a region between adjacent ones of the first lower conductive lines LCL1. Each of the second lower contacts LCT2 may be provided to penetrate the first to third interlayered insulating layers 110, 120, and 130 and may be connected to a corresponding one of the peripheral transistors PTR.

Each of the second upper contacts UCT2 may be provided to penetrate the first cell stack CS1 and may be connected to a terminal of a corresponding one of the peripheral transistors PTR. Each of the second upper contacts UCT2 may be vertically extended from a bottom surface of each of the second upper conductive lines UCL2 into regions between adjacent ones of the second lower conductive lines LCL2, between adjacent ones of the first upper conductive lines UCL1, and between adjacent ones of the first lower conductive lines LCL1. Each of the second upper contacts UCT2 may penetrate not only the fourth interlayered insulating layer 140 between adjacent ones of the second memory cells MC2 but also the first to third interlayered insulating layers 110, 120, and 130 and may be connected to a corresponding one of the peripheral transistors PTR. Each of the second upper contacts UCT2 may penetrate the first and second cell stacks CS1 and CS2 as described above, such that the second upper contacts UCT2 do not intersect, or, alternatively, contact (e.g., directly, electrically) any of the first lower lines LCL1, first lower contacts LCT1, first upper lines UCL1, first upper contacts UCT1, second lower lines LCL2 or second lower contacts LCT2.

Figure 8:
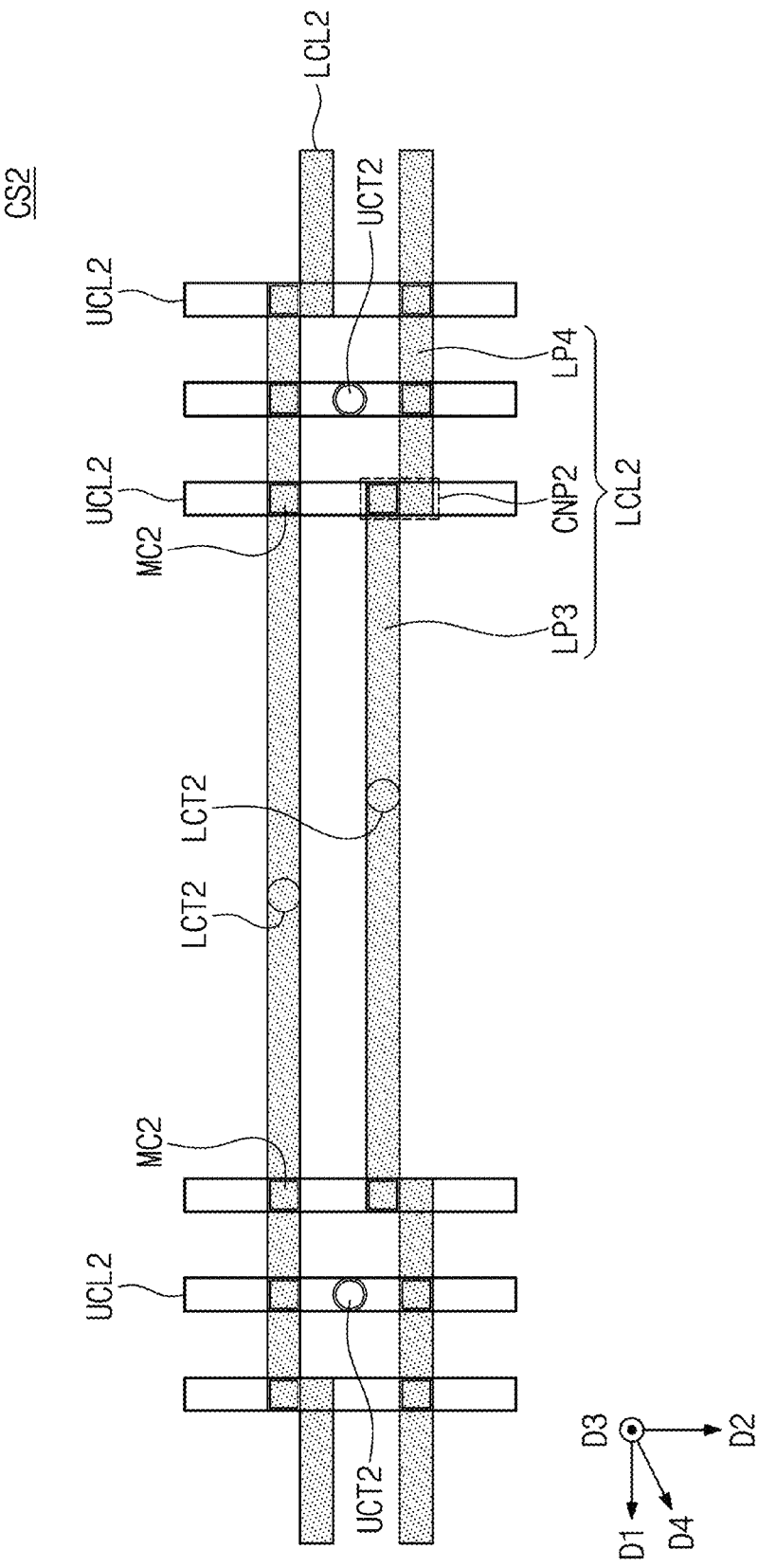
FIGS. 8 and 9 are a plan view and a perspective view illustrating a portion of a second cell stack.
Figure 9:
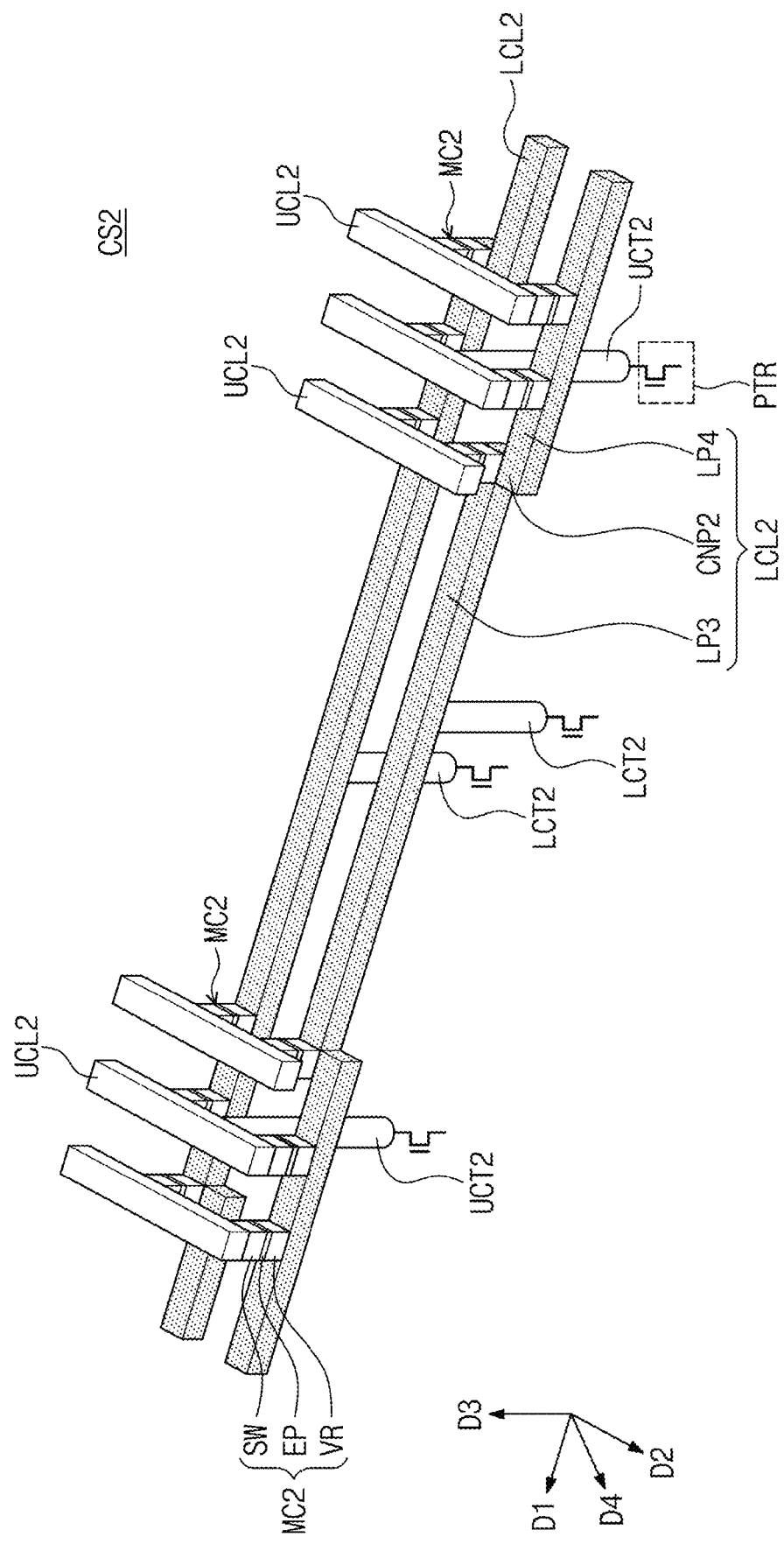

FIGS. 8 and 9 are a plan view and a perspective view illustrating a portion of a second cell stack CS2.

Referring to FIGS. 4, 8, and 9, each of the second lower conductive lines LCL2 may include a third line portion LP3, which is extended in the first direction D1, a fourth line portion LP4, which is offset from the third line portion LP3 in the second direction D2 and is extended in the first direction D1, and a second connecting portion CNP2, which is provided to connect the third line portion LP3 to the fourth line portion LP4. In some example embodiments, each of the second lower conductive lines LCL2 may have a bent line shape. The second lower conductive lines LCL2 may be disposed, such that the second connecting portions CNP2 of the second lower conductive lines LCL2 are aligned to each other in the fourth direction D4. The first lower conductive lines LCL1 and the second lower conductive lines LCL2 may be alternately arranged in the second direction D2 when viewed in a plan view. In some example embodiments, when viewed in a plan view, the first lower conductive lines LCL1 and the second lower conductive lines LCL2 may be disposed, such that the first connecting portions CNP1 and the second connecting portions CNP2 are aligned to each other in the fourth direction D4.

The third line portion LP3 of each of the second lower conductive lines LCL2 may be provided to cross corresponding ones of the second upper conductive lines UCL2.

The fourth line portion LP4 of each of the second lower conductive lines LCL2 may be provided to cross corresponding ones of the second upper conductive lines UCL2. The second memory cells MC2 may be selectively provided at intersection points between the third line portion LP3 of each of the second lower conductive lines LCL2 and the second upper conductive lines UCL2 and intersection points between the fourth line portion LP4 of each of the second lower conductive lines LCL2 and the second upper conductive lines UCL2.

Each of the second lower contacts LCT2 may be vertically extended in the third direction D3. As an example, each of the second lower contacts LCT2 may be connected to the third or fourth line portion LP3 or LP4 of each of the second lower conductive lines LCL2, but the inventive concepts are not limited to this example. Each of the second lower contacts LCT2 may be provided to penetrate the first cell stack CS1 and may be connected to a corresponding one of the peripheral transistors PTR. In some example embodiments, each of the second lower contacts LCT2 may be vertically extended from a bottom surface of each of the second lower conductive lines LCL2 into a region between adjacent ones of the first lower conductive lines LCL1 and may be connected to a corresponding one of the peripheral transistors PTR. In some example embodiments, the first and second lower contacts LCT1 and LCT2 may be arranged in a zigzag shape, when viewed in a plan view, but the inventive concepts are not limited to this example.

Each of the second upper contacts UCT2 may be disposed between the second connecting portions CNP2 of adjacent ones of the second lower conductive lines LCL2. Each of the second upper contacts UCT2 may be vertically extended from a bottom surface of each of the second upper conductive lines UCL2 into a region between the second connecting portions CNP2 of adjacent ones of the second lower conductive lines LCL2. Each of the second upper contacts UCT2 may be provided to penetrate the first cell stack CS1 and may be connected to a corresponding one of the peripheral transistors PTR. As an example, each of the second upper contacts UCT2 may be extended into regions between adjacent ones of the first upper conductive lines UCL1 and between the first connecting portions CNP1 of adjacent ones of the first lower conductive lines LCL1 and may be connected to a corresponding one of the peripheral transistors PTR.

In some example embodiments, when viewed in a plan view, the first and second upper contacts UCT1 and UCT2 may be disposed between the first and second connecting portions CNP1 and CNP2 of the first and second lower conductive lines LCL1 and LCL2 and may be aligned to the first and second connecting portions CNP1 and CNP2 in the fourth direction D4.

Referring back to FIGS. 4, 5A, 5B, and 5C, the third cell stack CS3 may include third lower conductive lines LCL3, third upper conductive lines UCL3 crossing the third lower conductive lines LCL3, and third memory cells MC3 between the third lower conductive lines LCL3 and the third upper conductive lines UCL3. The third lower conductive lines LCL3 may be disposed on the fifth interlayered insulating layer 150. The third lower conductive lines LCL3 may be extended in the first direction D1 and may be spaced apart from each other in the second direction D2. The first to third lower conductive lines LCL1, LCL2, and LCL3 may be alternately arranged in the second direction D2 when viewed in a plan view.

The third upper conductive lines UCL3 may be vertically spaced apart from the third lower conductive lines LCL3 in the third direction D3. The third upper conductive lines UCL3 may be extended in the second direction D2 and may be spaced apart from each other in the first direction D1. The first to third upper conductive lines UCL1, UCL2, and UCL3 may be alternately arranged in the first direction D1 when viewed in a plan view.

The third lower conductive lines LCL3 and the third upper conductive lines UCL3 may be formed of or include at least one of metallic materials (e.g., copper, tungsten, and/or aluminum) and/or metal nitrides (e.g., tantalum nitride, titanium nitride, and/or tungsten nitride). The third memory cells MC3 may be selectively disposed at intersection points of the third lower conductive lines LCL3 and the third upper conductive lines UCL3. Each of the third memory cells MC3 may include the variable resistance pattern VR, the switching pattern SW, and the electrode layer EP, which were described with reference to FIG. 3.

The third cell stack CS3 may include a sixth interlayered insulating layer 160 stacked on the fifth interlayered insulating layer 150. The sixth interlayered insulating layer 160 may cover the third lower conductive lines LCL3 and side surfaces of the third memory cells MC3. The third upper conductive lines UCL3 may be disposed on the sixth interlayered insulating layer 160. The sixth interlayered insulating layer 160 may be formed of or include at least one of, for example, oxide, nitride, and/or oxynitride.

The third cell stack CS3 may include third lower contacts LCT3, which are selectively connected to the third lower conductive lines LCL3, and third upper contacts UCT3, which are selectively connected to the third upper conductive lines UCL3. Each of the third lower contacts LCT3 may be provided to penetrate the first cell stack CS1 and the second cell stack CS2 and may be connected to a terminal of a corresponding one of the peripheral transistors PTR. Each of the third lower contacts LCT3 may be vertically extended from a bottom surface of each of the third lower conductive lines LCL3 into regions between adjacent ones of the second lower conductive lines LCL2 and between adjacent ones of the first lower conductive lines LCL1. Each of the third lower contacts LCT3 may be provided to penetrate the first to fifth interlayered insulating layers 110, 120, 130, 140, and 150 and may be connected to a corresponding one of the peripheral transistors PTR.

Each of the third upper contacts UCT3 may be provided to penetrate the first cell stack CS1 and the second cell stack CS2 and may be connected to a terminal of a corresponding one of the peripheral transistors PTR. Each of the third upper contacts UCT3 may be vertically extended from a bottom surface of each of the third upper conductive lines UCL3 into a region between adjacent ones of the third lower conductive lines LCL3. Each of the third upper contacts UCT3 may be extended into regions between adjacent ones of the second upper conductive lines UCL2, between adjacent ones of the second lower conductive lines LCL2, between adjacent ones of the first upper conductive lines UCL1, and between adjacent ones of the first lower conductive lines LCL1, such that the third upper contacts UCT3 does not intersect, or, alternatively, contact (e.g., directly, electrically) any of the above listed elements. Each of the third upper contacts UCT3 may be provided to penetrate not only the sixth interlayered insulating layer 160 between adjacent ones of the third memory cells MC3 but also the first to fifth interlayered insulating layers 110, 120, 130, 140, and 150 and may be connected to a corresponding one of the peripheral transistors PTR.

Figure 10:
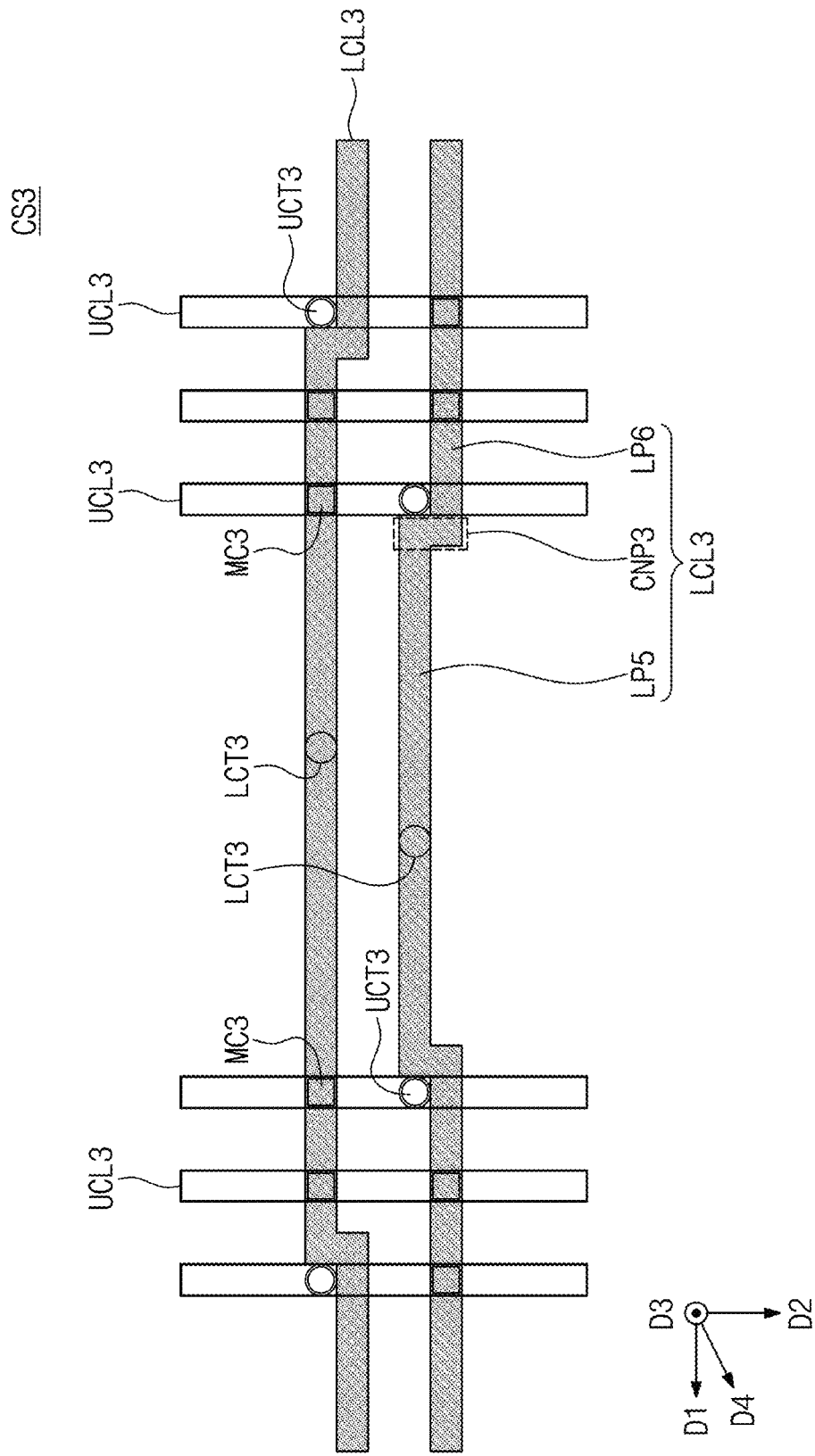
FIGS. 10 and 11 are a plan view and a perspective view illustrating a portion of a third cell stack.
Figure 11:
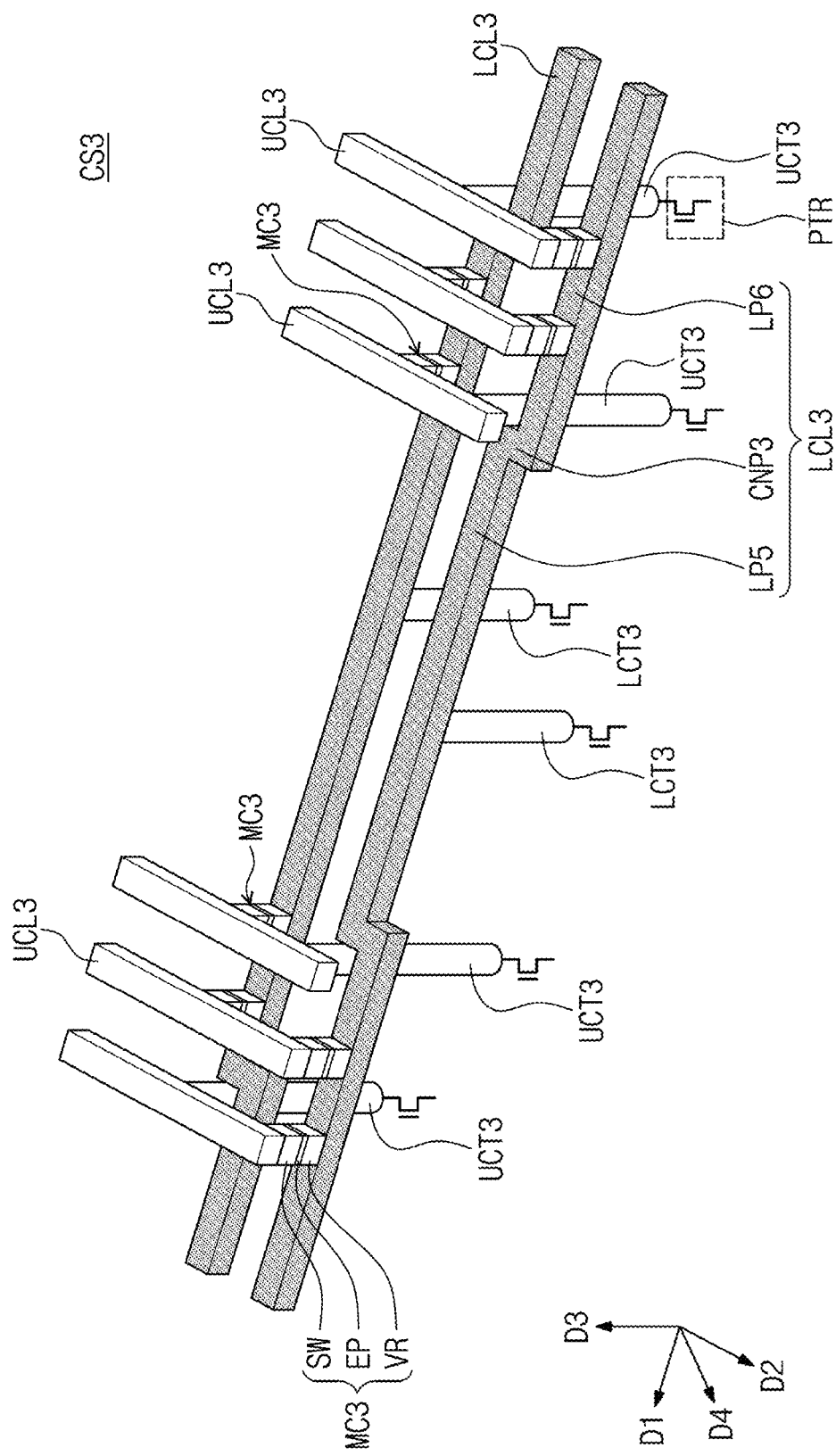

FIGS. 10 and 11 are a plan view and a perspective view illustrating a portion of a third cell stack CS3.

Referring to FIGS. 4, 10, and 11, each of the third lower conductive lines LCL3 may include a fifth line portion LP5, which is extended in the first direction D1, a sixth line portion LP6, which is offset from the fifth line portion LP5 in the second direction D2 and is extended in the first direction D1, and a third connecting portion CNP3, which is provided to connect the fifth line portion LP5 to the sixth line portion LP6. In some example embodiments, each of the third lower conductive lines LCL3 may have a bent line shape. The third lower conductive lines LCL3 may be disposed, such that the third connecting portions CNP3 of the third lower conductive lines LCL3 are aligned to each other in the fourth direction D4. The first to third lower conductive lines LCL1, LCL2, and LCL3 may be alternately arranged in the second direction D2 when viewed in a plan view. In some example embodiments, the first to third lower conductive lines LCL1, LCL2, and LCL3 may be disposed, such that the first to third connecting portions CNP1, CNP2, and CNP3 are aligned to each other in the fourth direction D4, when viewed in a plan view.

The fifth line portion LP5 of each of the third lower conductive lines LCL3 may be provided to cross corresponding ones of the third upper conductive lines UCL3. The sixth line portion LP6 of each of the third lower conductive lines LCL3 may be provided to cross corresponding ones of the third upper conductive lines UCL3. The third memory cells MC3 may be selectively provided at intersection points between the fifth line portion LP5 of each of the third lower conductive lines LCL3 and the third upper conductive lines UCL3 and at intersection points between the sixth line portion LP6 of each of the third lower conductive lines LCL3 and the third upper conductive lines UCL3.

Each of the third lower contacts LCT3 may be vertically extended in the third direction D3. For example, each of the third lower contacts LCT3 may be connected to the fifth or sixth line portion LP5 or LP6 of each of the third lower conductive lines LCL3, however, the inventive concepts are not limited to this example. Each of the third lower contacts LCT3 may be provided to penetrate the first and second cell stacks CS1 and CS2 and may be connected to a corresponding one of the peripheral transistors PTR. In some example embodiments, each of the third lower contacts LCT3 may be vertically extended from a bottom surface of each of the third lower conductive lines LCL3 into regions between adjacent ones of the second lower conductive lines LCL2 and between adjacent ones of the first lower conductive lines LCL1 and may be connected to a corresponding one of the peripheral transistors PTR. In some example embodiments, the first to third lower contacts LCT1, LCT2, and LCT3 may be arranged in a zigzag shape, when viewed in a plan view, but the inventive concepts are not limited to this example.

Each of the third upper contacts UCT3 may be disposed between the third connecting portions CNP3 of adjacent ones of the third lower conductive lines LCL3. Each of the third upper contacts UCT3 may be disposed to be closer to either of the adjacent ones of the third lower conductive lines LCL3. Each of the third upper contacts UCT3 may be vertically extended from a bottom surface of each of the third upper conductive lines UCL3 into a region between the third connecting portions CNP3 of the adjacent ones of the third lower conductive lines LCL3. Each of the third upper contacts UCT3 may be provided to penetrate the first and second cell stacks CS1 and CS2 and may be connected to a corresponding one of the peripheral transistors PTR. As an example, each of the third upper contacts UCT3 may be extended into regions between adjacent ones of the second upper conductive lines UCL2 and between the second connecting portions CNP2 of adjacent ones of the second lower conductive lines LCL2. Each of the third upper contacts UCT3 may be extended into regions between adjacent ones of the first upper conductive lines UCL1 and between the first connecting portions CNP1 of adjacent ones of the first lower conductive lines LCL1 and may be connected to a corresponding one of the peripheral transistors PTR.

In some example embodiments, when viewed in a plan view, the first to third upper contacts UCT1, UCT2, and UCT3 may be disposed between the first to third connecting portions CNP1, CNP2, and CNP3 of the first to third lower conductive lines LCL1, LCL2, and LCL3 and may be aligned to the first to third connecting portions CNP1, CNP2, and CNP3 in the fourth direction D4 when viewed in a plan view.

Figure 12:
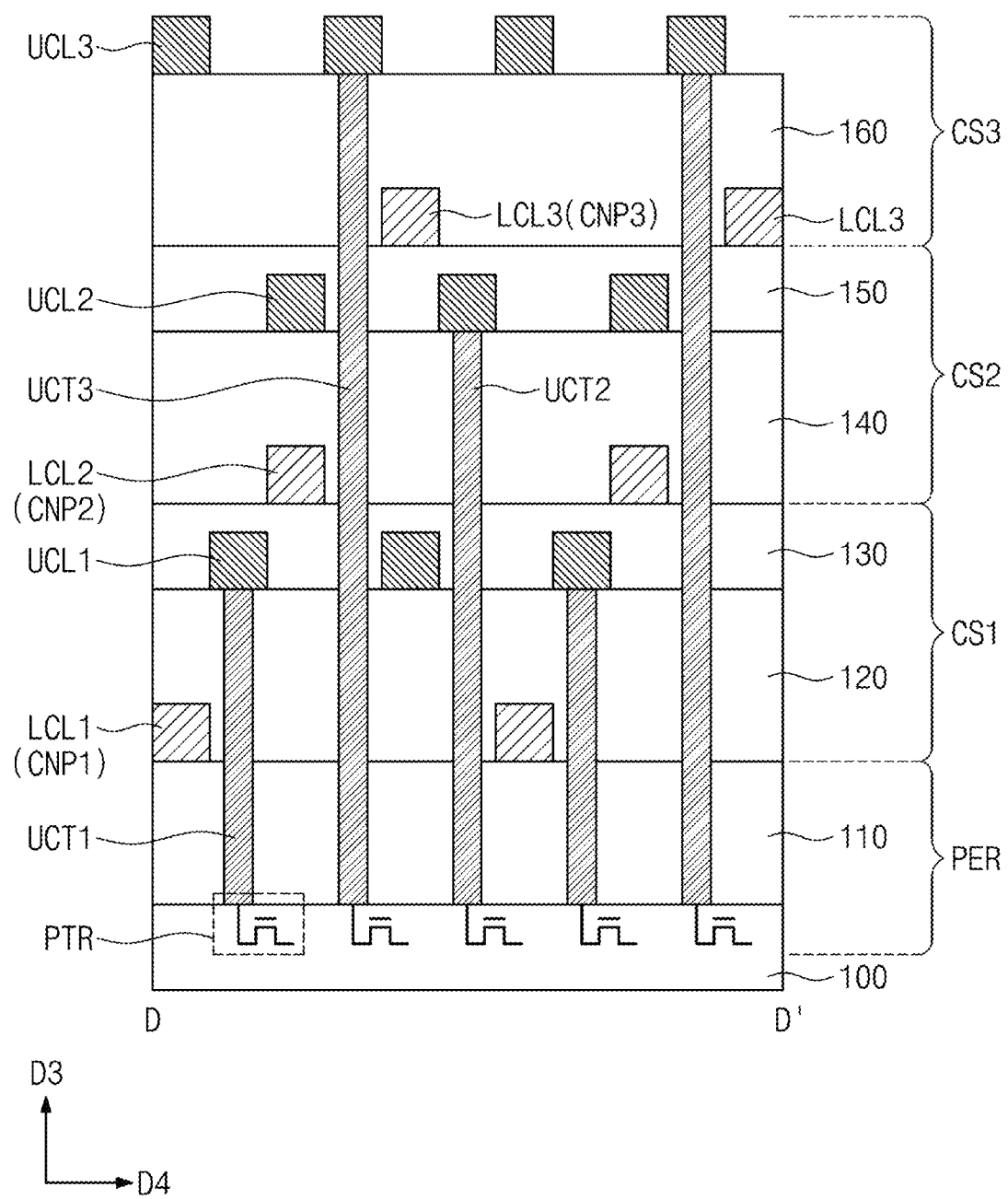
FIGS. 12 and 13 are sectional views taken along line D-D' and E-E' of FIG. 4, respectively.
Figure 13:
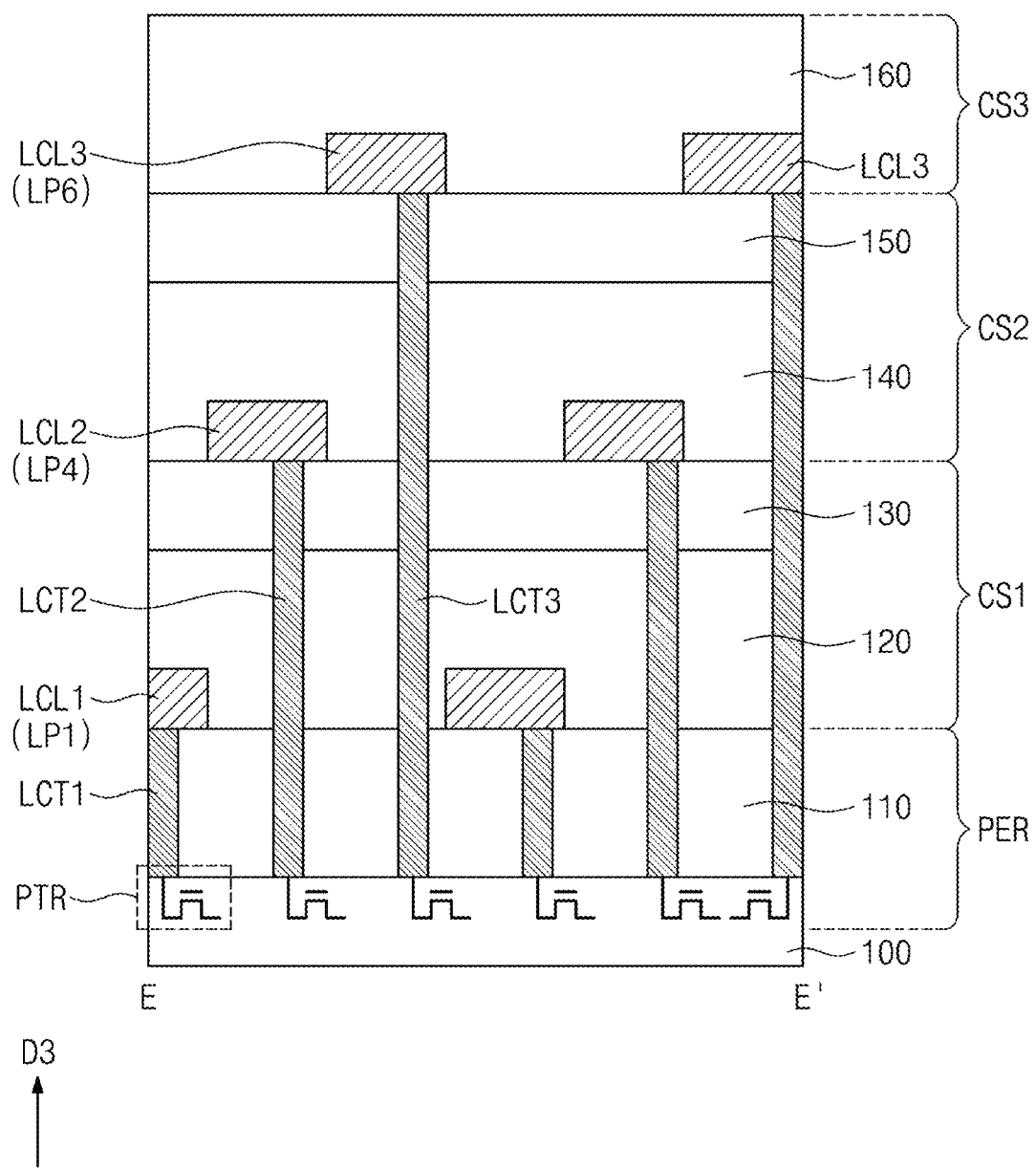

FIGS. 12 and 13 are sectional views taken along line D-D' and E-E' of FIG. 4, respectively.

Referring to FIGS. 4 and 12, the first to third connecting portions CNP1, CNP2, and CNP3 of the first to third lower conductive lines LCL1, LCL2, and LCL3 and the first to third upper contacts UCT1, UCT2, and UCT3 may be alternately arranged in the fourth direction D4 when viewed in a plan view. For example, each of the first upper contacts UCT1 may be offset from the first connecting portion CNP1 of a corresponding one of the first lower conductive lines LCL1 in the fourth direction D4, may penetrate the first and second interlayered insulating layers 110 and 120, and may be connected to a corresponding one of the peripheral transistors PTR. The second connecting portion CNP2 of each of the second lower conductive lines LCL2 may be offset from a corresponding one of the first upper contacts UCT1 in the fourth direction D4. Each of the second upper contacts UCT2 may be offset from the second connecting portion CNP2 of a corresponding one of the second lower conductive lines LCL2 in the fourth direction D4, may penetrate the first to fourth interlayered insulating layers 110, 120, 130, and 140, and may be connected to a corresponding one of the peripheral transistors PTR. The third connecting portion CNP3 of each of the third lower conductive lines LCL3 may be offset from a corresponding one of the second upper contacts UCT2 in the fourth direction D4. Each of the third upper contacts UCT3 may be offset from the third connecting portion CNP3 of a corresponding one of the third lower conductive lines LCL3 in the fourth direction D4, may penetrate the first to sixth interlayered insulating layers 110, 120, 130, 140, 150, and 160, and may be connected to a corresponding one of the peripheral transistors PTR.

Referring to FIGS. 4 and 13, the first to third lower conductive lines LCL1, LCL2, and LCL3 may be alternately arranged in the second direction D2. Each of the first lower contacts LCT1 may be connected to the first or second line portion LP1 or LP2 of each of the first lower conductive lines LCL1, may penetrate the first interlayered insulating layer 110, and may connected to a corresponding one of the peripheral transistors PTR. Each of the second lower contacts LCT2 may be connected to the third or fourth line portion LP3 or LP4 of each of the second lower conductive lines LCL2, may penetrate the first to third interlayered insulating layers 110, 120, and 130, and may be connected to a corresponding one of the peripheral transistors PTR. Each of the third lower contacts LCT3 may be connected to the fifth or sixth line portion LP5 or LP6 of each of the third lower conductive lines LCL3, may penetrate the first to fifth interlayered insulating layers 110, 120, 130, 140, and 150, and may be connected to a corresponding one of the peripheral transistors PTR. In some example embodiments, the first to third lower contacts LCT1, LCT2, and LCT3 may be provided to form, for example, a zigzag arrangement in the second direction D2, when viewed in a plan view.

According to some example embodiments of the inventive concepts, the first lower conductive lines LCL1 and the first upper conductive lines UCL1 may be connected to the peripheral transistors PTR, which are used to operate the first memory cells MC1, through the first lower contacts LCT1 and the first upper contacts UCT1. Each of the first lower contacts LCT1 may be vertically extended from a bottom surface of each of the first lower conductive lines LCL1 toward the substrate 100 and may be connected to a corresponding one of the peripheral transistors PTR, and each of the first upper contacts UCT1 may be vertically extended from a bottom surface of each of the first upper conductive lines UCL1 into a region between adjacent ones of the first lower conductive lines LCL1 and may be connected to a corresponding one of the peripheral transistors PTR. Accordingly, the peripheral transistors PTR to operate the first memory cells MC1 may be locally disposed below the cell stacks CS1, CS2, and CS3.

The second lower conductive lines LCL2 and the second upper conductive lines UCL2 may be connected to the peripheral transistors PTR, which are used to operate the second memory cells MC2, through the second lower contacts LCT2 and the second upper contacts UCT2. Each of the second lower contacts LCT2 and the second upper contacts UCT2 may penetrate the first cell stack CS1 and may be connected to a corresponding one of the peripheral transistors PTR. Accordingly, the peripheral transistors PTR to operate the second memory cells MC2 may be locally disposed below the cell stacks CS1, CS2, and CS3.

In addition, the third lower conductive lines LCL3 and the third upper conductive lines UCL3 may be connected to the peripheral transistors PTR, which are used to operate the third memory cells MC3, through the third lower contacts LCT3 and the third upper contacts UCT3. Each of the third lower contacts LCT3 and the third upper contacts UCT3 may penetrate the first and second cell stacks CS1 and CS2 and may be connected to a corresponding one of the peripheral transistors PTR. Accordingly, the peripheral transistors PTR to operate the third memory cells MC3 may be locally disposed below the cell stacks CS1, CS2, and CS3.

Since the peripheral transistors PTR to operate the memory cells MC1, MC2, and MC3 are locally disposed below the cell stacks CS1, CS2, and CS3, it may be possible to reduce a chip size of a variable resistance memory device, in which the plurality of cell stacks CS1, CS2, and CS3 are stacked. In addition, since each of the first to third lower contacts LCT1, LCT2, and LCT3 and the first to third upper contacts UCT1, UCT2, and UCT3 is connected to a corresponding one of the peripheral transistors PTR through an underlying structure, it may be possible to simplify an interconnection structure to connect the first to third lower conductive lines LCL1, LCL2, and LCL3 and the first to third upper conductive lines UCL1, UCL2, and UCL3 to the peripheral transistors PTR.

Accordingly, a variable resistance memory device with a reduced chip size and a simple interconnection structure may be provided.

Hereinafter, a method of fabricating a variable resistance memory device according to some example embodiments of the inventive concepts will be described with reference to FIGS. 4 and 5A to 5C. For the sake of brevity, an element previously described with reference to FIGS. 1 to 13 may be identified by the same reference number without repeating an overlapping description thereof.

Referring to FIGS. 4, 5A, 5B, and 5C, peripheral transistors PTR may be formed on a substrate 100. The peripheral transistors PTR may be, for example, metal-oxide-semiconductor field-effect transistors (MOSFETs). A first interlayered insulating layer 110 may be formed on the substrate 100 to cover the peripheral transistors PTR.

First lower contacts LCT1 may be formed in the first interlayered insulating layer 110. In some example embodiments, the formation of the first lower contacts LCT1 may include forming first lower contact holes in the first interlayered insulating layer 110, forming a conductive layer on the first interlayered insulating layer 110 to fill the first lower contact holes, and planarizing the conductive layer to expose a top surface of the first interlayered insulating layer 110. As a result of the planarization process, the first lower contacts LCT1 may be locally formed in the first lower contact holes.

First lower conductive lines LCL1 may be formed on the first interlayered insulating layer 110. The first lower conductive lines LCL1 may be formed to be connected to the first lower contacts LCT1, selectively. The formation of the first lower conductive lines LCL1 may include forming a conductive layer on the first interlayered insulating layer 110 and patterning the conductive layer. As a result of the patterning process, the first lower conductive lines LCL1 may be formed to have a bent line shape, as described with reference to FIGS. 4, 6, and 7. A second interlayered insulating layer 120 may be formed on the first interlayered insulating layer 110 to cover the first lower conductive lines LCL1. First memory cells MC1 may be formed in the second interlayered insulating layer 120. The formation of the first memory cells MC1 may include forming a plurality of holes in the second interlayered insulating layer 120 to define regions, in which the first memory cells MC1 will be formed, and locally forming the first memory cells MC1 in the holes.

First upper contacts UCT1 may be formed in the second interlayered insulating layer 120 and may be extended into the first interlayered insulating layer 110. Each of the first upper contacts UCT1 may be formed to penetrate the first and second interlayered insulating layers 110 and 120. As an example, the formation of the first upper contacts UCT1 may include forming first upper contact holes to penetrate the first and second interlayered insulating layers 110 and 120, forming a conductive layer on the second interlayered insulating layer 120 to fill the first upper contact holes, and planarizing the conductive layer to expose a top surface of the second interlayered insulating layer 120. As a result of the planarization process, the first upper contacts UCT1 may be locally formed in the first upper contact holes.

First upper conductive lines UCL1 may be formed on the second interlayered insulating layer 120 to cross the first lower conductive lines LCL1. The first upper conductive lines UCL1 may be connected to the first upper contacts UCT1, selectively. The formation of the first upper conductive lines UCL1 may include forming a conductive layer on the second interlayered insulating layer 120 and patterning the conductive layer. A third interlayered insulating layer 130 may be formed on the second interlayered insulating layer 120 to cover the first upper conductive lines UCL1.

Second lower contacts LCT2 may be formed in the third interlayered insulating layer 130 and may be extended into the first and second interlayered insulating layers 110 and 120. Each of the second lower contacts LCT2 may be formed to penetrate the first to third interlayered insulating layers 110, 120, and 130. In some example embodiments, the formation of the second lower contacts LCT2 may include forming second lower contact holes to penetrate the first to third interlayered insulating layers 110, 120, and 130, forming a conductive layer on the third interlayered insulating layer 130 to fill the second lower contact holes, and planarizing the conductive layer to expose a top surface of the third interlayered insulating layer 130. As a result of the planarization process, the second lower contacts LCT2 may be locally formed in the second lower contact holes.

Second lower conductive lines LCL2 may be formed on the third interlayered insulating layer 130. The second lower conductive lines LCL2 may be connected to the second lower contacts LCT2, selectively. The formation of the second lower conductive lines LCL2 may include forming a conductive layer on the third interlayered insulating layer 130 and patterning the conductive layer. As a result of the patterning process, the second lower conductive lines LCL2 may be formed to have a bent line shape, as described with reference to FIGS. 4, 8, and 9. A fourth interlayered insulating layer 140 may be formed on the third interlayered insulating layer 130 to cover the second lower conductive lines LCL2. Second memory cells MC2 may be formed in the fourth interlayered insulating layer 140. The second memory cells MC2 may be formed by substantially the same method as that for the first memory cells MC1.

Second upper contacts UCT2 may be formed in the fourth interlayered insulating layer 140 and may be extended into the first to third interlayered insulating layers 110, 120, and 130. Each of the second upper contacts UCT2 may be formed to penetrate the first to fourth interlayered insulating layers 110, 120, 130, and 140. In some example embodiments, the formation of the second upper contacts UCT2 may include forming second upper contact holes to penetrate the first to fourth interlayered insulating layers 110, 120, 130, and 140, forming a conductive layer on the fourth interlayered insulating layer 140 to fill the second upper contact holes, and planarizing the conductive layer to expose a top surface of the fourth interlayered insulating layer 140. As a result of the planarization process, the second upper contacts UCT2 may be locally formed in the second upper contact holes.

Second upper conductive lines UCL2 may be formed on the fourth interlayered insulating layer 140 to cross the second lower conductive lines LCL2. The second upper conductive lines UCL2 may be connected to the second upper contacts UCT2, selectively. The formation of the second upper conductive lines UCL2 may include forming a conductive layer on the fourth interlayered insulating layer 140 and patterning the conductive layer. A fifth interlayered insulating layer 150 may be formed on the fourth interlayered insulating layer 140 to cover the second upper conductive lines UCL2.

Third lower contacts LCT3 may be formed in the fifth interlayered insulating layer 150 and may be extended into the first to fourth interlayered insulating layers 110, 120, 130, and 140. Each of the third lower contacts LCT3 may penetrate the first to fifth interlayered insulating layers 110, 120, 130, 140, and 150. The third lower contacts LCT3 may be formed by substantially the same method as that for the second lower contacts LCT2.

Third lower conductive lines LCL3 may be formed on the fifth interlayered insulating layer 150. The third lower conductive lines LCL3 may be connected to the third lower contacts LCT3, selectively. The formation of the third lower conductive lines LCL3 may include forming a conductive layer on the fifth interlayered insulating layer 150 and patterning the conductive layer. As a result of the patterning process, the third lower conductive lines LCL3 may be formed to have a bent line shape, as described with reference to FIGS. 4, 10, and 11. A sixth interlayered insulating layer 160 may be formed on the fifth interlayered insulating layer 150 to cover the third lower conductive lines LCL3. Third memory cells MC3 may be formed in the sixth interlayered insulating layer 160. The third memory cells MC3 may be formed by substantially the same method as that for the first and second memory cells MC1 and MC2.

Third upper contacts UCT3 may be formed in the sixth interlayered insulating layer 160 and may be extended into the first to fifth interlayered insulating layers 110, 120, 130, 140, and 150. Each of the third upper contacts UCT3 may be provided to penetrate the first to sixth interlayered insulating layers 110, 120, 130, 140, 150, and 160. The third upper contacts UCT3 may be formed by substantially the same method as that for the second upper contacts UCT2.

Third upper conductive lines UCL3 may be formed on the sixth interlayered insulating layer 160 to cross the third lower conductive lines LCL3. The third upper conductive lines UCL3 may be connected to the third upper contacts UCT3, selectively. The third upper conductive lines UCL3 may be formed by substantially the same method as that for the second upper conductive lines UCL2.

According to some example embodiments of the inventive concepts, it may be possible to realize a variable resistance memory device with a reduced chip size and a simple interconnection structure.

While example embodiments of the inventive concepts have been particularly shown and described, it will be understood by one of ordinary skill in the art that variations in form and detail may be made therein without departing from the spirit and scope of the attached claims.

What is claimed is:

1. A variable resistance memory device, comprising:
    lower conductive lines on a substrate, the lower conductive lines being extended in a first direction and being spaced apart from each other in a second direction crossing the first direction;
    upper conductive lines on the lower conductive lines to cross the lower conductive lines; and
    memory cells between the lower conductive lines and the upper conductive lines,
    wherein each of the lower conductive lines includes
        a first line portion extended in the first direction;
        a second line portion offset from the first line portion in the second direction and extended in the first direction; and
        a connecting portion connecting the first line portion to the second line portion, connecting portions of adjacent lower conductive lines extend in a same direction.

2. The variable resistance memory device of claim 1, wherein the connecting portions of the lower conductive lines are aligned with each other in a third direction crossing the first and second directions.

3. The variable resistance memory device of claim 2, wherein the memory cells are at intersection points between the first line portion and the upper conductive lines and between the second line portion and the upper conductive lines.

4. The variable resistance memory device of claim 2, further comprising upper contacts, which are respectively connected to the upper conductive lines,
    wherein at least one of the upper contacts is between the connecting portions of adjacent ones of the lower conductive lines.

5. The variable resistance memory device of claim 4, wherein the at least one of the upper contacts is extended from a bottom surface of a corresponding one of the upper conductive lines into a region between the connecting portions of the adjacent ones of the lower conductive lines.

6. The variable resistance memory device of claim 4, further comprising peripheral transistors between the substrate and the lower conductive lines,
wherein the at least one of the upper contacts is connected to a terminal of a corresponding one of the peripheral transistors.

7. The variable resistance memory device of claim 6, further comprising lower contacts connected to the lower conductive lines,
wherein at least one of the lower contacts is extended from a bottom surface of a corresponding one of the lower conductive lines toward the substrate and is connected to a terminal of a corresponding one of the peripheral transistors.

8. The variable resistance memory device of claim 1, wherein each of the memory cells comprises a variable resistance pattern and a switching pattern, which are stacked in a direction perpendicular to a top surface of the substrate.

9. The variable resistance memory device of claim 8, wherein the variable resistance pattern comprises a phase change material.

10. A variable resistance memory device, comprising:
a peripheral circuit portion on a substrate; and
a first cell stack and a second cell stack sequentially stacked on the peripheral circuit portion,
wherein the first cell stack comprises:
first lower conductive lines extended in a first direction and spaced apart from each other in a second direction crossing the first direction;
first upper conductive lines on the first lower conductive lines to cross the first lower conductive lines;
first memory cells between the first lower conductive lines and the first upper conductive lines; and
first upper contacts connecting respective ones of the first upper conductive lines to the peripheral circuit portion,
the second cell stack comprises second lower conductive lines, which are extended in the first direction and are spaced apart from each other in the second direction, and
the first lower conductive lines and the second lower conductive lines are alternately arranged in the second direction.

11. The variable resistance memory device of claim 10, wherein the second cell stack comprises:
second upper conductive lines on the second lower conductive lines to cross the second lower conductive lines; and
second memory cells at intersection points between the second lower conductive lines and the second upper conductive lines,
wherein the first upper conductive lines and the second upper conductive lines are extended in the second direction and are alternately arranged in the first direction.

12. The variable resistance memory device of claim 10, wherein each of the first lower conductive lines comprises:
a first line portion extended in the first direction;
a second line portion offset from the first line portion in the second direction and extended in the first direction; and
a first connecting portion connecting the first line portion to the second line portion,
wherein the first lower conductive lines are, such that the first connecting portions of the first lower conductive lines are aligned to each other in a third direction crossing the first and second directions.

13. The variable resistance memory device of claim 12, wherein at least one of the first upper contacts is between the first connecting portions of adjacent ones of the first lower conductive lines and is connected to the peripheral circuit portion.

14. The variable resistance memory device of claim 12, wherein each of the second lower conductive lines comprises:
a third line portion extended in the first direction;
a fourth line portion offset from the third line portion in the second direction and extended in the first direction; and
a second connecting portion connecting the third line portion to the fourth line portion,
wherein the first and second lower conductive lines are, such that the first and second connecting portions of the first and second lower conductive lines are alternately arranged in the third direction.

15. The variable resistance memory device of claim 14, wherein the second cell stack comprises:
second upper conductive lines on the second lower conductive lines to cross the second lower conductive lines;
second memory cells at intersection points between the second lower conductive lines and the second upper conductive lines; and
second upper contacts connected to the second upper conductive lines,
wherein at least one of the second upper contacts is between the second connecting portions of adjacent ones of the second lower conductive lines and is connected to the peripheral circuit portion.

16. The variable resistance memory device of claim 15, wherein the first upper conductive lines and the second upper conductive lines are extended in the second direction and are alternately arranged in the first direction, and
the at least one of the second upper contacts penetrates the first cell stack and is connected to the peripheral circuit portion.

17. The variable resistance memory device of claim 15, wherein the at least one of the second upper contacts is extended into a region between the first connecting portions of adjacent ones of the first lower conductive lines.

18. The variable resistance memory device of claim 10, wherein the first cell stack comprises first lower contacts, which are connected to the first lower conductive lines,
at least one of the first lower contacts is extended from a bottom surface of a corresponding one of the first lower conductive lines toward the substrate and is connected to the peripheral circuit portion.

19. The variable resistance memory device of claim 18, wherein the second cell stack comprises second lower contacts, which are connected to the second lower conductive lines, and
at least one of the second lower contacts penetrates the first cell stack and is connected to the peripheral circuit portion.

20. A variable resistance memory device, comprising:
a peripheral circuit portion on a substrate; and
a first cell stack and a second cell stack sequentially stacked on the substrate, wherein the second cell stack comprises:
   lower conductive lines each including
      a first line portion extended in a first direction,
      a second line portion offset from the first line portion in a second direction and extended in the first direction, and
      a connecting portion connecting the first line portion to the second line portion;
   upper conductive lines on the lower conductive lines to cross the lower conductive lines;
   memory cells between the lower conductive lines and the upper conductive lines;
   lower contacts connected to the lower conductive lines; and
   upper contacts connected to the upper conductive lines, each of the upper contacts being adjacent to at least one of the connection portions of the lower conductive lines,
wherein each of the lower contacts and the upper contacts penetrates the first cell stack and is connected to the peripheral circuit portion.

\* \* \* \* \*